(12) United States Patent
Mani

(10) Patent No.: US 7,173,847 B2
(45) Date of Patent: Feb. 6, 2007

(54) MAGNETIC STORAGE CELL

(75) Inventor: Krish Mani, San Pedro, CA (US)

(73) Assignee: MagSil Corporation, Santa Clara, CA (US)

( * ) Notice: Subject to any disclaimer, the term of this patent is extended or adjusted under 35 U.S.C. 154(b) by 94 days.

(21) Appl. No.: 10/701,319

(22) Filed: Nov. 4, 2003

(65) Prior Publication Data

US 2004/0233712 A1   Nov. 25, 2004

(51) Int. Cl.
  *G11C 11/14*   (2006.01)
  *G11C 11/02*   (2006.01)
  *G11C 5/02*    (2006.01)
  *G11C 5/06*    (2006.01)
  *G11C 5/08*    (2006.01)

(52) U.S. Cl. ................... 365/158; 365/171; 365/51; 365/63; 365/66

(58) Field of Classification Search ............... 365/171, 365/158, 173, 51, 61, 66, 172, 63
See application file for complete search history.

(56) References Cited

U.S. PATENT DOCUMENTS

| | | | | |
|---|---|---|---|---|
| 3,593,329 A | * | 7/1971 | Suzuki | 365/97 |
| 3,602,908 A | * | 8/1971 | Oshima et al. | 365/61 |
| 5,089,991 A | * | 2/1992 | Matthews | 365/9 |
| 2001/0040819 A1 | * | 11/2001 | Hayashi et al. | 365/158 |

* cited by examiner

*Primary Examiner*—J. H. Hur
(74) *Attorney, Agent, or Firm*—James E. Eakin

(57) ABSTRACT

A horizontally disposed elliptical or rectangular magnetic memory cell includes at least two conductive lines to carry current and a magnetic element disposed between the conductive lines. The current through the conductive lines induces a magnetic field, such that the magntic element is directly accessible. The magnetic memory cell can be sensed with a GMR head.

23 Claims, 6 Drawing Sheets

MAGNETIC STORAGE CELL

FIELD OF THE INVENTION

The present invention pertains to generally to memory storage devices and particularly to magnetic memory storage devices.

BACKGROUND OF THE INVENTION

Within the field of memories, there is continuing interest in finding ways to increase the storage density and speed of memories. As the personal use of small devices gain popularity, the memory of these equipments has to be modified to match the function and design of these small devices. Particularly, as more and more data needs to be stored in the memory, the memory needs to have the capacity and speed to handle such demand.

The discovery of new phenomena of magnetoresistive (MR) and giantmagnetoresistive (GMR) effect provided a significant advancement in the field of memory technology. This phenomena demonstrated that resistance of multilayer thin film comprised of ferromagnetic layers sandwiching a conducting layer can change significantly depending on the direction of an external magnetic field.

GMR is observed in magnetic metallic layered structures in which it is possible to orient the magnetic moments of the ferromagnetic layers relative to one another. One such type magnetic metallic layered structure consists of a stack of four magnetic thin films: a free magnetic layer, a nonmagnetic conducting layer, a magnetic pinned layer and an exchange layer. Magnetic orientation of the pinned layer is fixed and held in place by the exchange layer. By applying an external magnetic field, the magnetic orientation of the free layer may be changed with respect to the magnetic orientation of the pinned layer. The change in the magnetic orientation generates a significant change in the resistance of the metallic layered structures. The resistance of the structure determines the logical value to be stored therein. that are based on GMR technology, use it to control a sensor that responds to very small rotations of magnetic orientation of the GMR free layer due to magnetization on the disk. However, the present use of this technology in disk drives require the disk to rotate and head to position on the track to be read, which requires more than 10 ms. The disk drive therefore is not utilizing the full potential of fast response time of the GMR which could translate into small access time. The access time using GMR in existing technology generally spans between 3ns–5 ns.

There is a clear need in the industry to develop fast memories which can be used in disk drives as well as small equipments.

SUMMARY OF THE INVENTION

We have developed a memory cell utilizing the GMR technology which is not limited to disk drive technology but it may be used in other equipments such as cell phones, medical devices, high end servers, personal digital assistance (PDA) etc. Our unique memory cell design achieves technical advantages over what is currently available in the industry.

In one aspect of the invention disclosed herein includes a memory cell which comprises of at least two conductive lines to carry current. A magnetic element is disposed between the conductive lines. A magnetic field is induced by applying a current through the individual conductive lines. The polarity of the current through the conductive lines oppose each other so that the magnetic field generated by the currents are additive and provides a resultant magnitude which is the sum of the independent magnetic field generated by the individual conductive lines.

In another aspect of the invention disclosed herein includes a memory cell which comprises of at least two conductive lines and a magnetic element disposed between the two conductive lines. The conductive lines are shaped such that the conductive lines are disposed outwardly around the magnetic storage element thus exposing the magnetic storage element so that the magnetic element may be positioned in close proximity with any device that may be used to store or retrieve data.

In another aspect of the invention disclosed herein includes a memory cell which comprises of at least two conductive lines and a magnetic element disposed between the two conductive lines. In this embodiment the conductive lines and the magnetic element are separated by a dielectric. The conductive lines are shaped such that the conductive lines, those carrying the current, are disposed outwardly around the magnetic storage element. Here a third conductive line placed under the magnetic element to provide additional current that may be used to increase the magnetic field strength.

BRIEF DESCRIPTION OF THE DRAWINGS

The foregoing and other aspects of the invention will be appreciated in conjunction with the accompanying drawings, and a detailed description which follows.

DETAILED DESCRIPTION OF THE PREFERRED EMBODIMENTS

Figure 1:
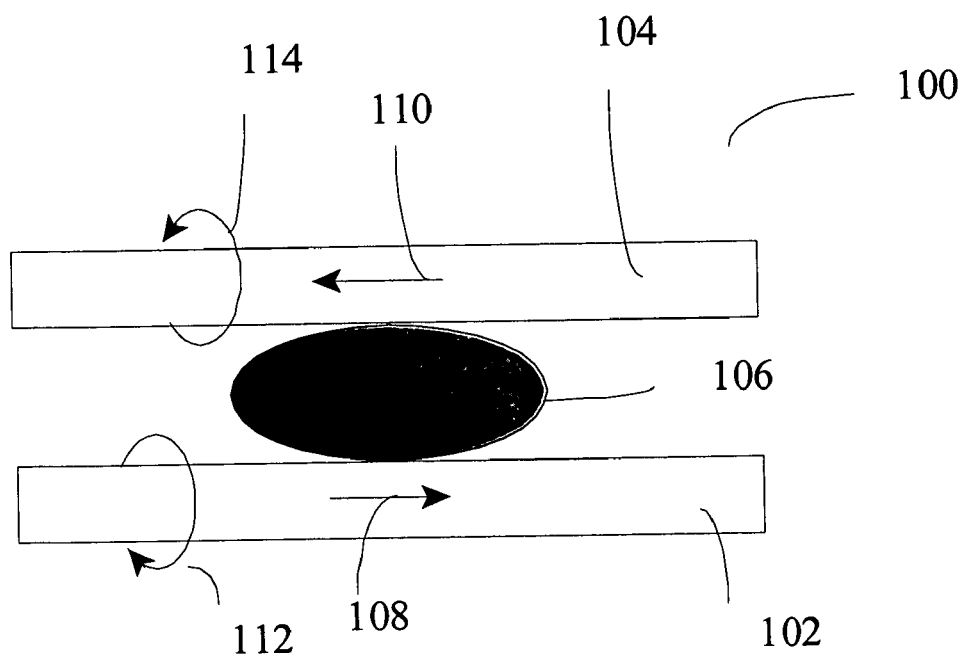
FIG. 1 shows a top view of magnetic storage cell 100.

FIG. 1 is a top view of a magnetic storage cell 100. The magnetic storage cell 100 comprises of at least two conductive lines 102 and 104 to carry current and a magnetic element 106 disposed between the conductive lines. When the conductive lines are attached to a current supply, (not shown) current will flow through the conductive lines as indicated by arrows 108 and 110. The direction of the current flow is adjusted so that the magnetic field induced by the current through the conductive lines will be cumulative to produce a stronger magnetic field. Data may be accessed by changing the resistance of a read head (not shown) using the GMR technology. In this case the current is flowing in the opposite direction so that the induced magnetic field is in the direction shown by the arrows 112 and 114. The induced magnetic field is used to change the resistance of the read head. The change of resistance is utilized to read and write data from/into the magnetic storage cell. The conductive lines 102 and 104 are parallel to one another and this in turn allows the total current needed for magnetization to be divided among the two conductive lines 102 and 104.

This design provides several advantages over the present design available in other magnetic storage devices. First, there are at least two conductive lines to carry the desired current so that the total amount current may be divided among the conductive lines. As such, by increasing the amount of current through individual conductive lines 102 and 104 by a small amount will increase the net amount of current available for magnetization. Also, by dividing the total current needed among the individual lines helps to avoid other problems, such as overheating, generally associated with large amount of current being carried by a single line. Generally current in the range of 15 mA to 25 mA is needed to induce the desired magnetic field in the range of 60 to 100 Gauss. This high amount of current may lead to heating. Thus dividing the current among several conducting lines will prevent such problems. Even though here we are showing only two conductive lines to carry the current, it is understood that more than two conductive lines may be used to divide the desired current as needed.

Here we have an elliptical shaped magnetic element 106 because elliptical shape is not uniform i.e. has shape anisotropy. The advantage of having a shape anisotropy for the magnetic element 106 is that the magnetic field needed to disturb the direction of the magnetic moments unintentionally is considerably higher compared to isotropic shapes.

Figure 1A:
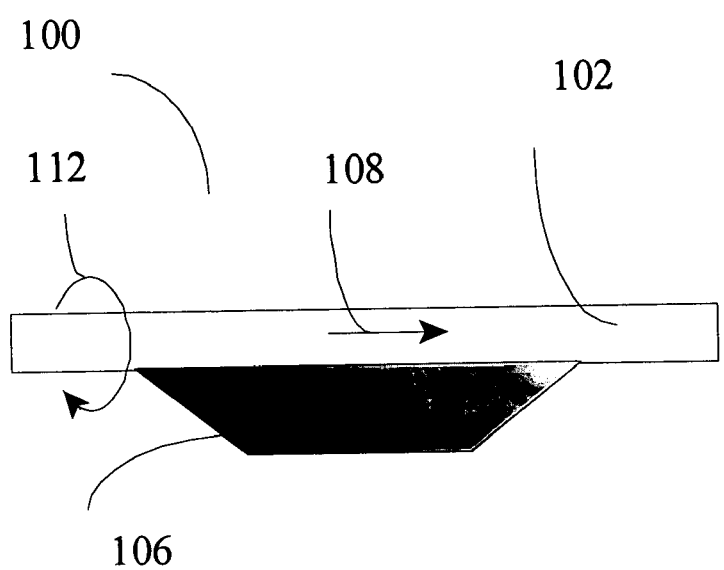
FIG. 1a shows the side view of the magnetic storage cell shown in FIG. 1.

FIG. 1a is a side view of the magnetic storage cell 100 as shown in FIG. 1. This figure shows the direction of the current through conductive line 102 indicated by arrow 108. This figure also shows the direction of the magnetic field, induced by the current through the conductive line 102 indicated by arrow 112.

Figure 2:
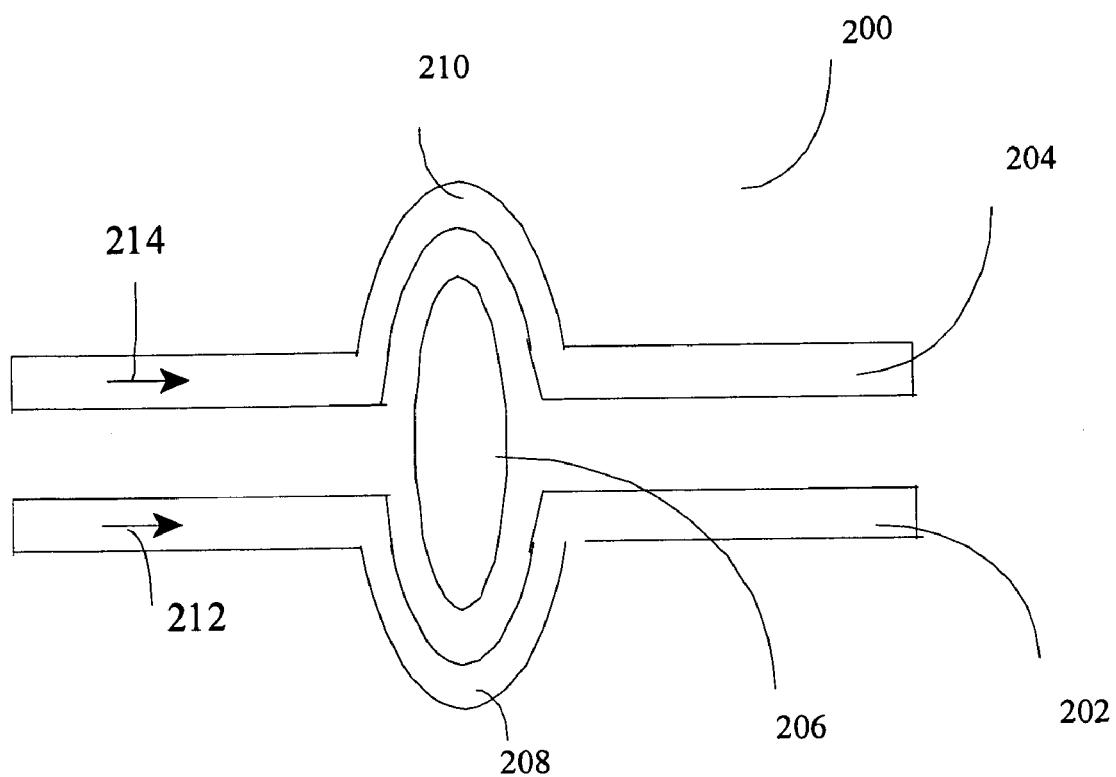
FIG. 2 shows the top view of a magnetic storage cell 200 showing the magnetic storage element 202 exposed.

FIG. 2 shows a top view of a magnetic storage cell 200. The magnetic storage cell 200 is made up of at least two conductive lines 202 and 204 to carry current and a magnetic element 206 disposed between the conductive lines. When the conductive lines 202 and 204 are attached to a current supply, (not shown) current will flow through the conductive lines. The current through the conductive lines will induce a magnetic field. The unique design in this Figure is such that the conductive lines 202 and 204 take a different shape around the magnetic element 206 so that the magnetic element is exposed. Here the conductive lines disposed outwardly around the magnetic storage element 206 forming an elliptical shape 208 and 210. Even though here the conductive lines around the magnetic element take on an elliptical shape they can take on other shapes as well such as rectangle, square, circle etc. The only necessary component is that the magnetic element 206 be directly accessible. The direct access to the magnetic element allows the data to be stored or retrieved from the magnetic storage cell 216. The direction of the current is indicated by the arrows 212 and 214. Even though here the direction of the current shown by the arrows 212 and 214 point in the same direction the polarity of the current can be adjusted in order to increase or decrease the magnetic field strength. For example, in order to get a stronger magnetic field the polarity of the current through the conductive lines 202 and 204 may be directed to oppose each other. With reference to FIG. 2, the direct accessibility provided by this design in turn will drastically reduce the time needed to retrieve or store the data into the magnetic storage cell. Once again we can read and write data from or to the magnetic storage cell by changing the resistance of the read head (not shown) which depends on the magnetization of the magnetic element located directly underneath it.

Figure 3:
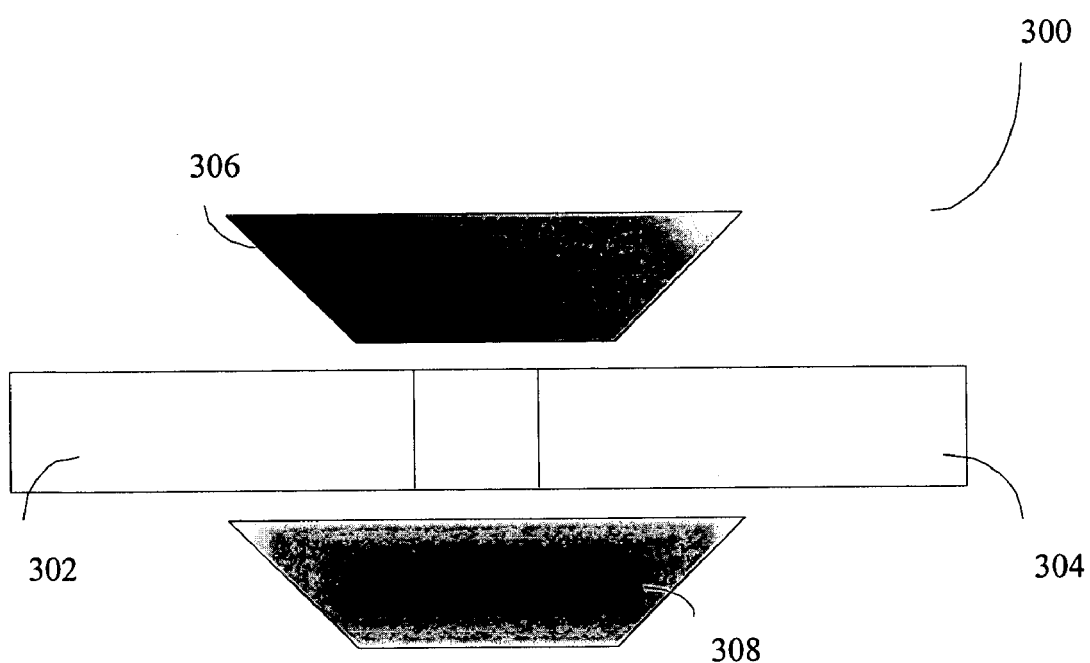
FIG. 3 illustrates by way of example how the unique design of FIG. 2 provides a read head direct access to the magnetic storage element.

FIG. 3 shows an application of a magnetic storage cell 300 of the kind described in FIG. 2. This figure is a cross section of a side view of a magnetic storage cell of the kind shown in FIG. 2. This figure further includes a read head 306 placed above the elliptical shape (not shown) formed by the conductive line 304. This figure further illustrates the uniqueness of this design where the conductive lines are disposed outwardly around the magnetic storage element 308. Once again the read head 306 has direct access to the magnetic element 308. Any standard logic circuit known in the industry can be used to store or retrieve information in/from the magnetic storage cell. Accordingly, in this case, when the read head receives an instruction to retrieve the data from the magnetic storage cell 300, the read head can immediately retrieve the data from the storage cell, which is located directly underneath the read head 306. Once again this allows faster storage and retrieval of information from the memory.

Figure 4:
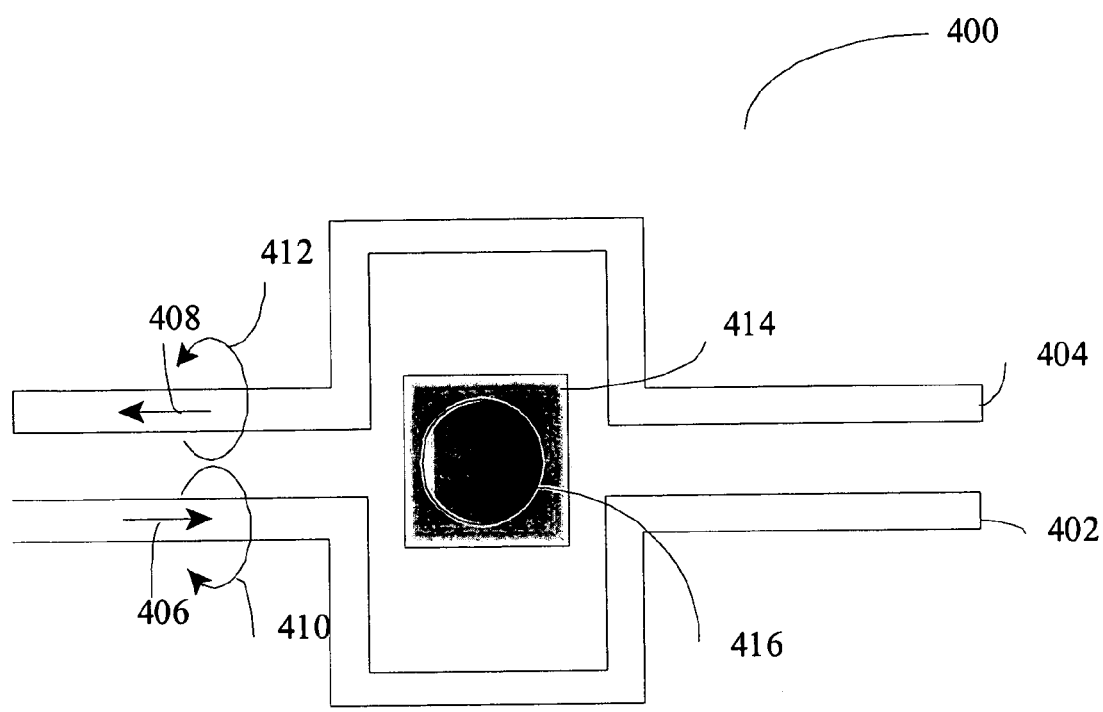
FIG. 4 shows the top view of a magnetic storage cell 400 with a read head 416 placed on top of a dielectric 414.

FIG. 4 is a top view magnetic storage cell 400. The magnetic storage cell 400 shown includes two conductive lines 402 and 404 and a magnetic element (not shown) disposed between the conductive lines 402 and 404. The conductive lines 402 and 404 are disposed outwardly in such a manner that they encapsulate the magnetic element. Here the conductive lines take a rectangular shape 409 around the magnetic element. This once again provide direct access to the memory cell. By giving a rectangular shape 409 around the magnetic element further provides an increased inductance which translates into stronger magnetic field to be used. Also, larger surface area helps to reduce the heat dissipation and thus avoiding the use cooling mechanisms.

A read head 416 as shown here may be used to store or retrieve the data into/from the cell. A dielectric 414 is placed between the read head 416 and the conductive lines 402 and 404 to prevent short circuiting. This magnetic storage cell 400 further includes another conductive line 422 (not shown) below the magnetic element 418. The magnetic element is separated from the conductive line 422 (not shown) by another dielectric element 420 (not shown). The conductive line 422 provides additional current to induce even stronger magnetic field.

Figure 4A:
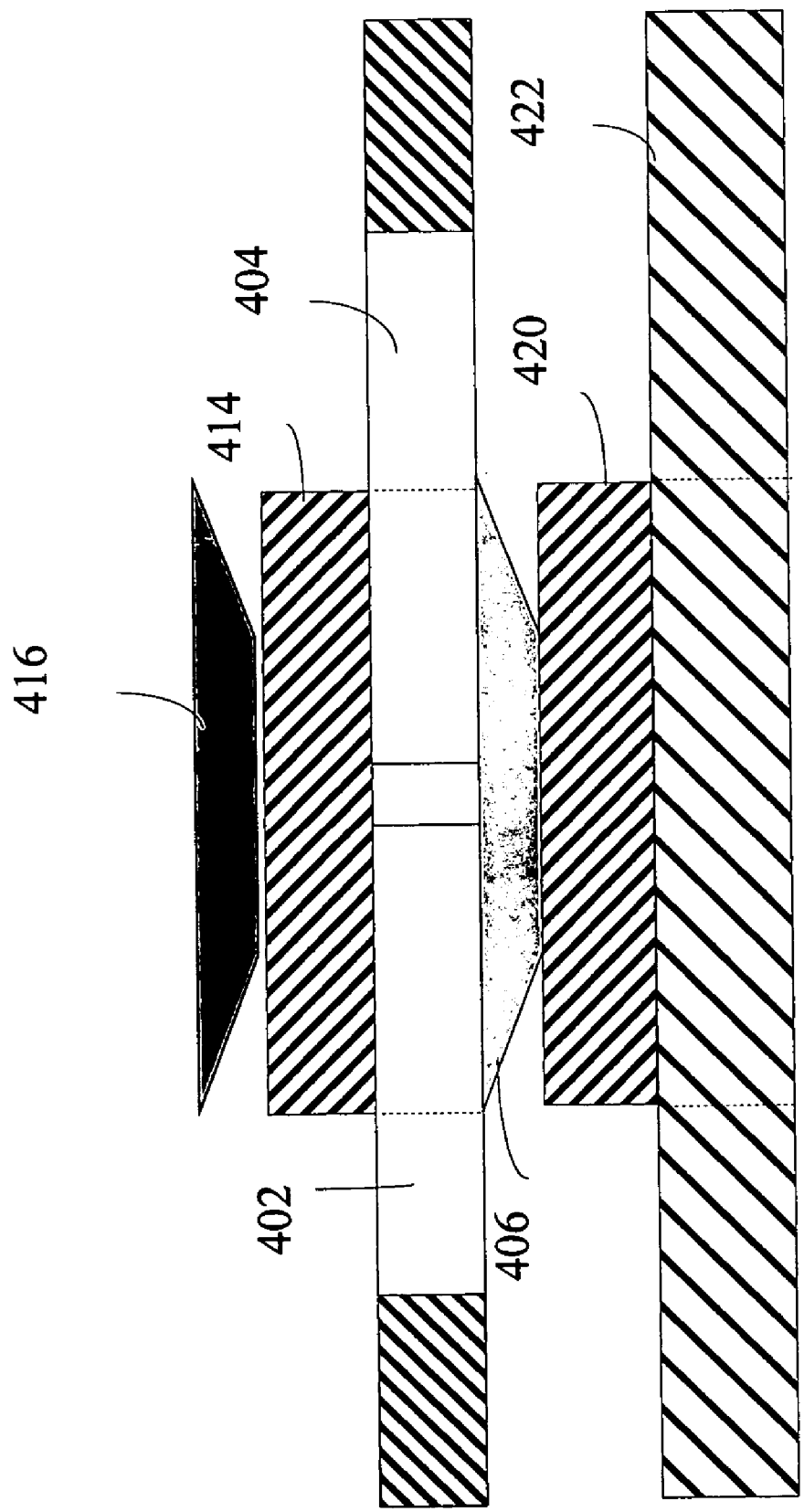
FIG. 4a shows a side vies of magnetic storage cell 400 shown in FIG. 4.

FIG. 4a is a cross section of the type of magnetic storage cell 400 shown in FIG. 4. The basic configuration of the magnetic storage cell described above includes two conductive lines 402 and 404 and a magnetic element 406 is disposed between the conductive lines. The current through the conductive lines would induce a magnetic field. The magnetic element 406 acts as magnetic field generating means. The resistance of the read head 416 depends on the direction of the magnetic field generated by the magnetic element. Based on the resistance value of the read head a 0 or 1 is stored in the magnetic storage cell.

Figure 5:
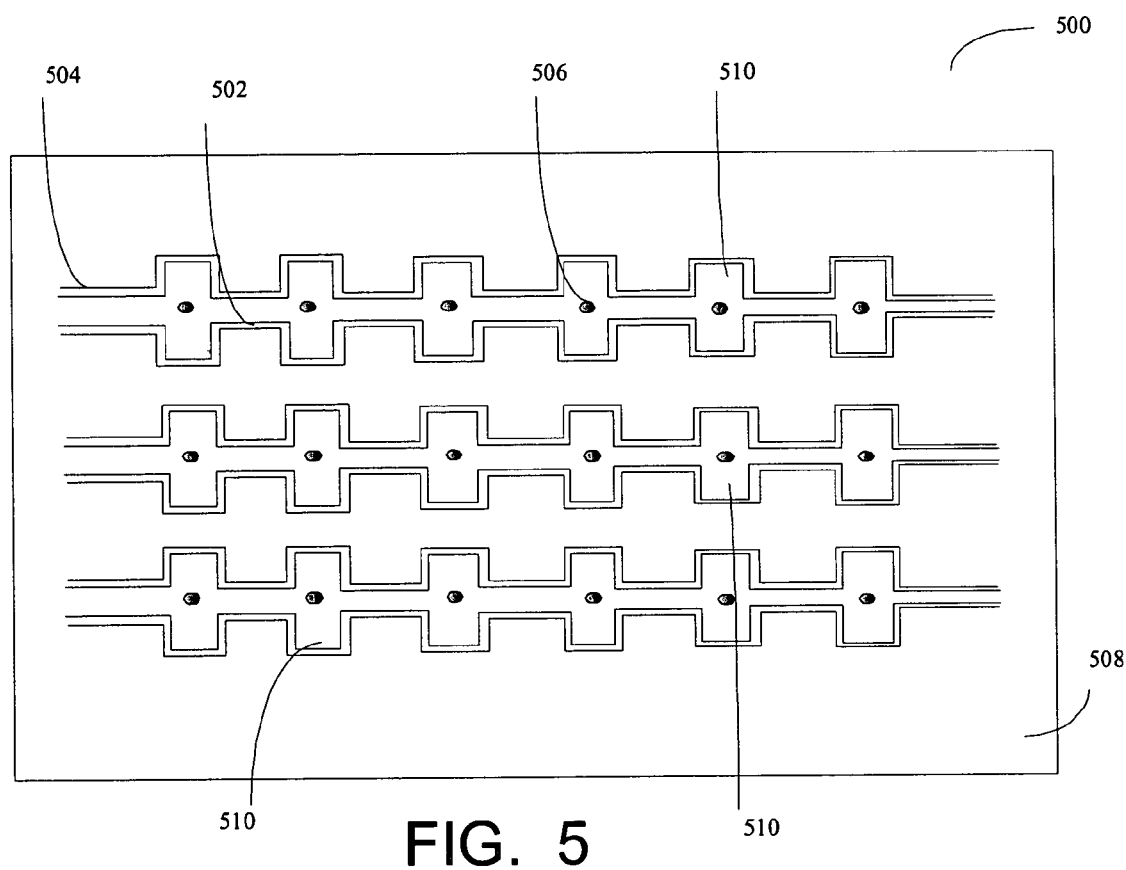
FIG. 5 shows the top view of an array of magnetic storage cells 510 embedded in a structure 500.

FIG. 5 shows top view a structure 500 embedded in it is an array of magnetic storage cells 510 of the kind described in FIG. 4. The array of magnetic storage cell is embedded in a support element 508. The support element may be made of semiconductor, ceramic, glass, etc. The storage cell 510 includes two conductive lines 502 and 504. A magnetic element 506 is disposed in between the two conductive lines 502 and 504. Each of the magnetic element 506 is ensured to contain at least one magnetic domain. A current through conductive lines 502 and 504 would induce a magnetic field. The magnetic element 506 acts as a magnetic field generating means. Any standard access logic circuits may be used to access the storage cell. The access logic decides which storage cell 510 should be accessed from the array. Since the conductive lines are disposed outwardly a read head (not shown) can have direct access to the data stored in the cell. The direct access helps to prevent the read head from accessing the wrong magnetic storage cell 510.

The above described preferred embodiments are not intended to limit the scope of the present invention, as one skilled in the art can, in view of the present disclosure, expand such embodiments to correspond with the subject matter of the invention claimed below.

What is claimed is:

1. A magnetic storage cell comprising:
   a) at least two conductive lines to carry a predetermined amount of current; and
   b) a magnetic element having horizontal anisotropy and horizontally disposed between the conductive lines such that the strength of a net magnetic field induced by the predetermined current through the respective conductive lines is cumulative.

2. The magnetic storage cell according to claim 1, wherein the conductive lines are parallel to each other.

3. The magnetic storage cell according to claim 2, wherein the polarity of the predetermined current through the respective conductive lines opposes each other.

4. The magnetic storage cell according to claim 3, wherein the conductive lines are disposed outwardly around the magnetic element thus exposing the magnetic storage element for storing or retrieving information.

5. The magnetic storage cell according to claim 4, wherein a dielectric element is disposed between the conductive lines and the magnetic element.

6. The magnetic storage cell of claim 1 wherein the magnetic element is elliptical in shape.

7. The magnetic storage cell of claim 1 wherein the magnetic element is rectangular in shape.

8. A magnetic storage cell that stores information by changing magnetization direction comprising:
   a) a horizontally disposed magnetic element having horizontal anisotropy; and
   b) at least two conductive lines disposed outwardly around the horizontally disposed magnetic element such that a predetermined current required to induce a magnetic field is divided among the conductive lines.

9. The magnetic storage cell of claim 8, wherein the conductive lines are parallel to each other.

10. The magnetic storage cell of claim 8, wherein the polarity of the currents through the conductive lines oppose each other.

11. The magnetic storage cell of claim 10, wherein the magnetic field changes the direction of magnetization in a reading head.

12. The magnetic storage cell of claim 10, further comprising conductive lines below the magnetic storage element.

13. The magnetic storage cell of claim 8 wherein the magnetic element is elliptical in shape.

14. The magnetic storage cell of claim 8 wherein the magnetic element is rectangular in shape.

15. A magnetic storage cell, that stores information by changing magnetization direction comprising a magnetic element and at least two conductive lines disposed outwardly around the magnetic element such that a predetermined current required to induce a magnetic field is divided among the conductive lines, and wherein the polarity of the current through the conductive lines is the same.

16. A memory device within an array of memory storage cells, the memory storage cell comprising:
   a) a horizontally disposed magnetic element having horizontal anisotropy;
   b) at least two conductive lines, disposed outwardly around the magnetic element such that the strength of a net magnetic field induced by a current through the respective conductive lines is cumulative; and
   c) a dielectric separating the conductive lines from the magnetic element.

17. The memory device of claim 16 wherein at least the magnetic element is embedded in a base structure.

18. The memory device of claim 17 wherein the currents through the conductive lines are opposed in polarity.

19. The memory device of claim 17 further comprising a conductive line under the magnetic element.

20. The memory device of claim 19 wherein a dielectric is disposed between the conductive line under the magnetic element and the magnetic element.

21. The memory device of claim 19 wherein a net current needed to induce the magnetic field is divided among the conductive lines.

22. The memory device of claim 16 wherein the magnetic element is elliptical in shape.

23. The memory device of claim 16 wherein the magnetic element is rectangular in shape.

* * * * *